United States Patent
Miyazaki et al.

(10) Patent No.: US 8,060,326 B2
(45) Date of Patent: Nov. 15, 2011

(54) MEASURING APPARATUS, MEASURING METHOD AND TEST APPARATUS

(75) Inventors: Masashi Miyazaki, Gunma (JP); Hiroshi Ito, Saitama (JP)

(73) Assignee: Advantest Corporation, Tokyo (JP)

( * ) Notice: Subject to any disclaimer, the term of this patent is extended or adjusted under 35 U.S.C. 154(b) by 437 days.

(21) Appl. No.: 12/356,543

(22) Filed: Jan. 21, 2009

(65) Prior Publication Data
US 2010/0023289 A1    Jan. 28, 2010

(30) Foreign Application Priority Data
Jan. 25, 2008   (JP) .................. 2008-015389

(51) Int. Cl.
G01R 13/00   (2006.01)

(52) U.S. Cl. .......................... 702/69; 702/89

(58) Field of Classification Search .......... 702/69, 702/74, 85, 89, 104, 181; 324/158, 537, 324/751, 754; 327/170, 538; 341/161, 166; 714/814

See application file for complete search history.

(56) References Cited

U.S. PATENT DOCUMENTS
6,622,103 B1 * 9/2003 Miller .......................... 702/89

FOREIGN PATENT DOCUMENTS
JP   6-094853   4/1994

* cited by examiner

Primary Examiner — John H Le
(74) Attorney, Agent, or Firm — Jianq Chyun IP Office

(57) ABSTRACT

Provided is a measurement apparatus including a first timing detecting section that detects first change timings of a signal under measurement, a second timing detecting section that detects second change timings of the signal under measurement, a buffer section that buffers data indicating the first change timings detected by the first timing detecting section and data indicating the second change timings detected by the second timing detecting section, and a calculating section that acquires, from the buffer section, the data indicating the first change timings and the data indicating the second change timings, calculates a temporal relationship between the first change timings and the second change timings, and outputs the temporal relationship.

10 Claims, 8 Drawing Sheets

US 8,060,326 B2

MEASURING APPARATUS, MEASURING METHOD AND TEST APPARATUS

CROSS REFERENCE TO RELATED APPLICATION

The present application claims priority from a Japanese Patent Application No. 2008-015389 filed on Jan. 25, 2008, the contents of which are incorporated herein by reference.

BACKGROUND

1. Technical Field

The present invention relates to a measurement apparatus, a measurement method, and a test apparatus. In particular, the present invention relates to a measurement apparatus, a measurement method, and a test apparatus for measuring a time between change points, i.e. edges, of a signal under measurement.

2. Related Art

Japanese Patent Application Publication No. 6-94853 discloses a time measurement circuit that measures the timings of pulse edges. This time measurement circuit includes a counter that counts a clock, a latch that latches a value of the counter, a triangular wave generating circuit that generates a triangular wave in synchronization with the clock, an AD converter, and an adding device.

The latch acquires the counter value at the edges of the pulse under measurement. The AD converter samples the level of the triangular wave the edges of the pulse under measurement. The adding device outputs the edge timing of the pulse under measurement obtained by adding together the count value acquired by the latch and the output data of the AD converter. This time measurement circuit can accurately measure the edge timing of the pulse under measurement in less than one cycle of the clock.

When measuring a short pulse width that is only a few nanoseconds, the time measurement circuit must be provided with a high-speed AD converter to continuously sample the pulse at short intervals. Such a high-speed AD converter, however, is expensive and has relatively low accuracy.

SUMMARY

Therefore, it is an object of an aspect of the innovations herein to provide a measurement apparatus, a measurement method, and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary measurement apparatus may comprise a first timing detecting section that detects first change timings of a signal under measurement; a second timing detecting section that detects second change timings of the signal under measurement; a buffer section that buffers data indicating the first change timings detected by the first timing detecting section and data indicating the second change timings detected by the second timing detecting section; and a calculating section that acquires, from the buffer section, the data indicating the first change timings and the data indicating the second change timings, calculates a temporal relationship between the first change timings and the second change timings, and outputs the temporal relationship.

According to a second aspect related to the innovations herein, one exemplary measurement method may comprise detecting first change timings of a signal under measurement; detecting second change timings of the signal under measurement; buffering data indicating the first change timings and data indicating the second change timings using a buffer section; and acquiring, from the buffer section, the data indicating the first change timings and the data indicating the second change timings, calculating a temporal relationship between the first change timings and the second change timings, and outputting the temporal relationship.

According to a third aspect related to the innovations herein, one exemplary test apparatus may include a test apparatus that tests a device under test, comprising a test signal supplying section that supplies the device under test with a test signal for testing the device under test; and a measurement apparatus that measures a timing of a response signal output by the device under test in response to the test signal. The measurement apparatus includes a first timing detecting section that detects first change timings of the response signal; a second timing detecting section that detects second change timings of the response signal; a first FIFO section that buffers the first change timings detected by the first timing detecting section; a second FIFO section that buffers the second change timings detected by the second timing detecting section; and a calculating section that acquires, from the first FIFO section and the second FIFO section, the first change timings and the second change timings, calculates a temporal relationship between the first change timings and the second change timings, and outputs the temporal relationship.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
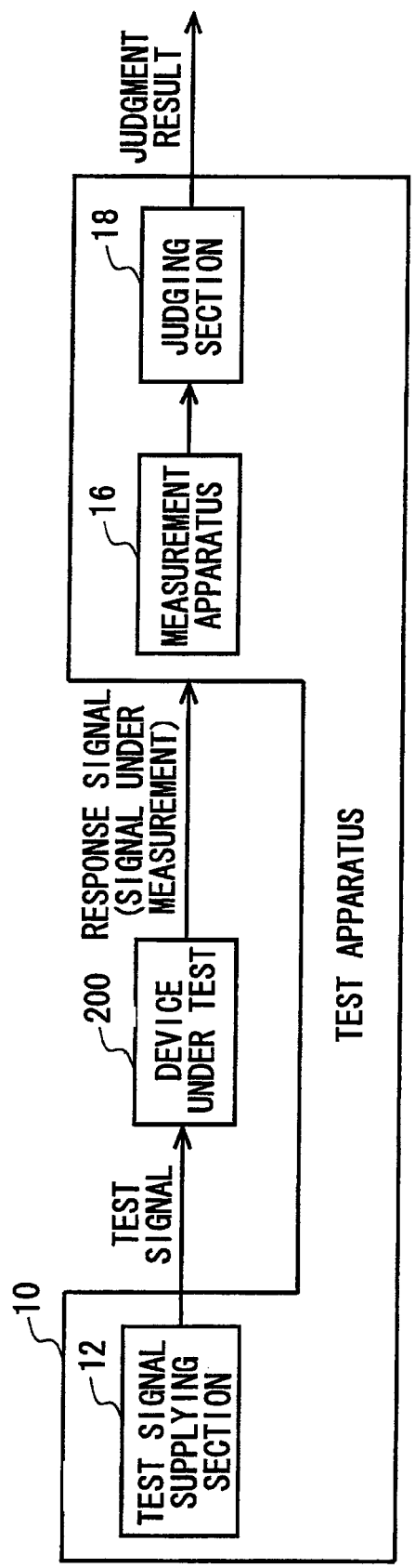
FIG. 1 shows an exemplary configuration of a test apparatus 10 according to an embodiment of the present invention, along with a device under test 200.

FIG. 1 shows an exemplary configuration of a test apparatus 10 according to an embodiment of the present invention, along with a device under test 200. The test apparatus 10 tests the device under test 200, which is a semiconductor device or the like.

The test apparatus 10 is provided with a test signal supplying section 12, a measurement apparatus 16, and a judging-section 18. The test signal supplying section 12 supplies the device under test 200 with a test signal to test the device under test 200.

The measurement apparatus 16 receives a signal under measurement, which is a signal output by the device under test 200 in response to the test signal. The measurement apparatus 16 measures the time difference between a first change timing and a second change timing of the signal under measurement. For example, the measurement apparatus 16 may measure (i) a time difference from a rising edge to a falling edge, i.e. a pulse width of the H logic period, of the signal under measurement, or (ii) a time difference from a falling edge to a rising edge, i.e. a pulse width of the L logic period, of the signal under measurement. In addition, the measurement apparatus 16 may measure the cycle or frequency of the signal under measurement, a time between a reference timing and a rising edge of the signal under measurement, and a time between a reference timing and a falling edge of the signal under measurement.

The judging section 18 receives the measurement result from the measurement apparatus 16 and judges the acceptability of the device under test 200. The judging section 18 may output this judgment result to an external control apparatus or the like.

Figure 2:
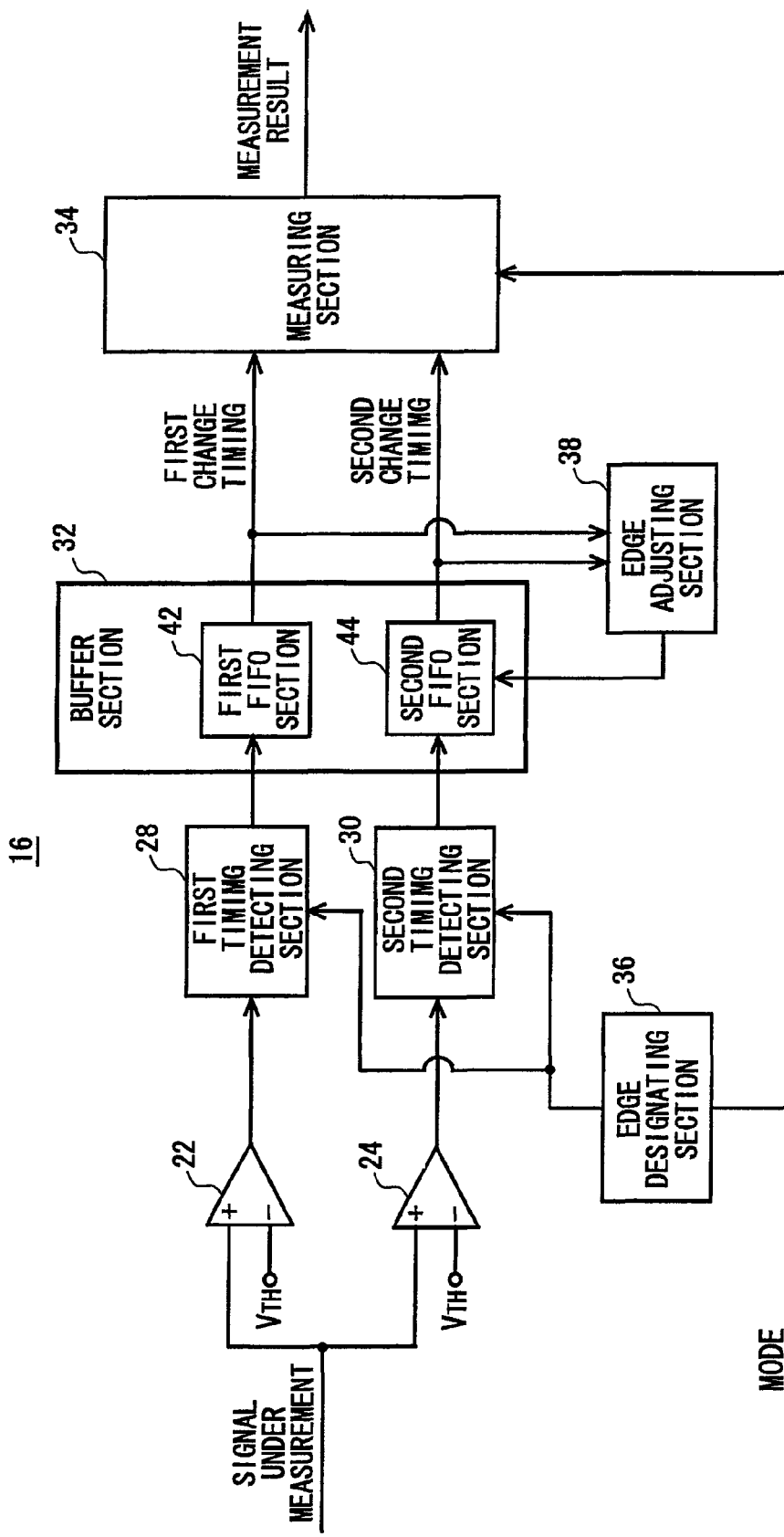
FIG. 2 shows an exemplary configuration of the measurement apparatus 16 according to the present embodiment.

FIG. 2 shows an exemplary configuration of the measurement apparatus 16 according to the present embodiment. The measurement apparatus 16 includes a first comparing section 22, a second comparing section 24, a first timing detecting section 28, a second timing detecting section 30, a buffer section 32, a measuring section 34, an edge designating section 36, and an edge adjusting section 38.

The first comparing section 22 and the second comparing section 24 detect whether the signal under measurement is greater than a threshold value $V_{TH}$. The first comparing section 22 may output a comparison signal that is logic H when the signal under measurement is greater than the threshold value $V_{TH}$ and logic L when the signal under measurement is less than or equal to the threshold value $V_{TH}$. In this way, the first comparing section 22 and the second comparing section 24 can output comparison signals that indicate a rising edge, i.e. when the signal under measurement changes from a value less than the threshold value $V_{TH}$ to a value greater than the threshold value $V_{TH}$, and a falling edge, i.e. when the signal under measurement changes from a value greater than the threshold value $V_{TH}$ to a value less than the threshold value $V_{TH}$. The first comparing section 22 and the second comparing section 24 may each be supplied with a different threshold value $V_{TH}$.

The first timing detecting section 28 detects a first change timing, which is a timing at which the signal under measurement changes in a first direction. That is, the first timing detecting section 28 detects the first change timing to be either (i) the timing of a rising edge at which the signal under measurement changes from a value less than the threshold value $V_{TH}$ to a value grater than the threshold value $V_{TH}$ or (ii) the timing of a falling edge at which the signal under measurement changes from a value greater than the threshold value $V_{TH}$ to a value less than the threshold value $V_{TH}$.

In the present embodiment, the first timing detecting section 28 detects the first change timing of the signal under measurement to be an edge, e.g. a rising or falling edge, of the comparison signal supplied by the first comparing section 22. The first timing detecting section 28 sequentially detects first change timings of the signal under measurement to sequentially output data indicating the first change timings.

The second timing detecting section 30 detects a second change timing, which is a timing at which the signal under measurement changes in a second direction that differs from the first direction. In other words, if the first timing detecting section 28 detects a rising edge of the signal under measurement, the second timing detecting section 30 detects the second change timing to be a falling edge of signal under measurement. If the first timing detecting section 28 detects a falling edge of the signal under measurement, the second timing detecting section 30 detects the second change timing to be a rising edge of signal under measurement.

In the present embodiment, the second timing detecting section 30 detects the second change timing of the signal under measurement to be an edge, e.g. a rising or falling edge, that is different from the type of edge detected by the first timing detecting section 28. The second timing detecting section 30 sequentially detects second change timings of the signal under measurement to sequentially output data indicating the second change timings.

The buffer section 32 buffers data indicating the first change timings detected by the first timing detecting section 28 and data indicating the second change timings detected by the second timing detecting section 30. The buffer section 32 may include a first FIFO section 42 and a second FIFO section 44.

The first FIFO section 42 sequentially stores the data indicating the first change timings detected by the first timing detecting section 28, and outputs the stored data in the order in which it was input. The second FIFO section 44 sequentially stores the data indicating the second change timings detected by the second timing detecting section 30, and outputs the stored data in the order in which it was input.

The measuring section 34 acquires the data indicating the first change timings and the second change timings from the buffer section 32, and sequentially measures the width of each pulse of the signal under measurement. In addition, the measuring section 34 may measure the cycle or frequency of the signal under measurement, the time between a reference timing and a rising edge of the signal under measurement, and the time between a reference timing and a falling edge of the signal under measurement. Furthermore, the measuring section 34 may measure the average pulse width of the signal under measurement, the average cycle or frequency of the signal under measurement, or the average time to a rising edge or a falling edge.

The edge designating section 36 designates whether the first timing detecting section 28 and the second timing detecting section 30 detect edges at the first change timings and the second change timings that are respectively rising edges and falling edges or falling edges and rising edges, according to a mode designated by an external section. For example, when measuring a pulse width of the signal under measurement, the edge designating section 36 sets the first timing detecting section 28 to detect either rising edges or falling edges as the first change timings and sets the second timing detecting section 30 to detect, as the second change timings, whichever type of edge was not set as the first change timing.

If one piece of data indicating a second change timing that is stored at the top of the second FIFO section 44 is earlier than one piece of data indicating a first change timing stored at the top of the first FIFO section 42, the edge adjusting section 38 deletes the one piece of data representing the second change timing at the top of the second FIFO section 44. Therefore, the measuring section 34 can calculate the time difference from a first change timing to a second change timing that follows the first change timing by subtracting the data stores at the top of the first FIFO section 42 from the data stored at the top of the second FIFO section 44.

Figure 3:
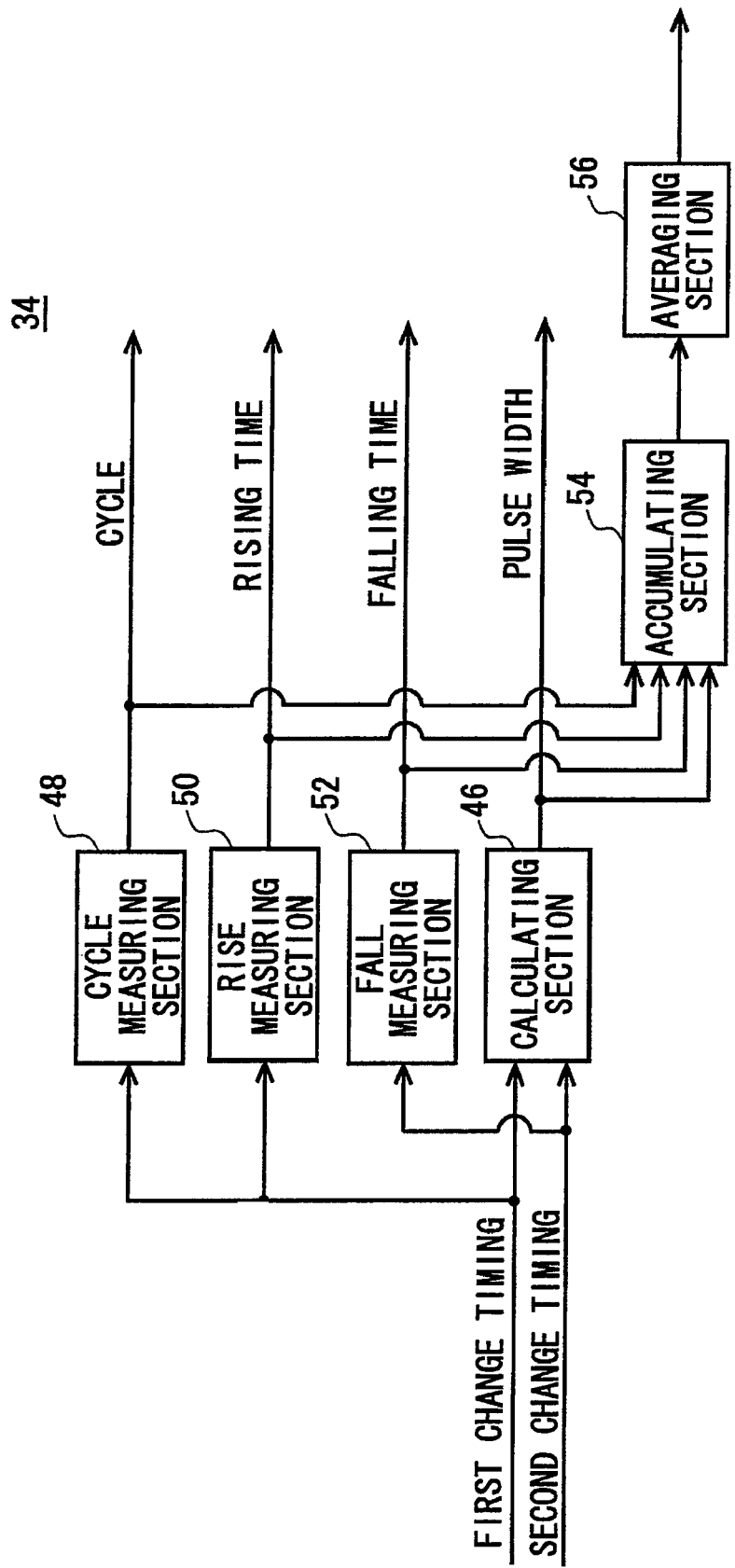
FIG. 3 shows an exemplary configuration of a measuring section 34 according to the present embodiment.
Figure 4:
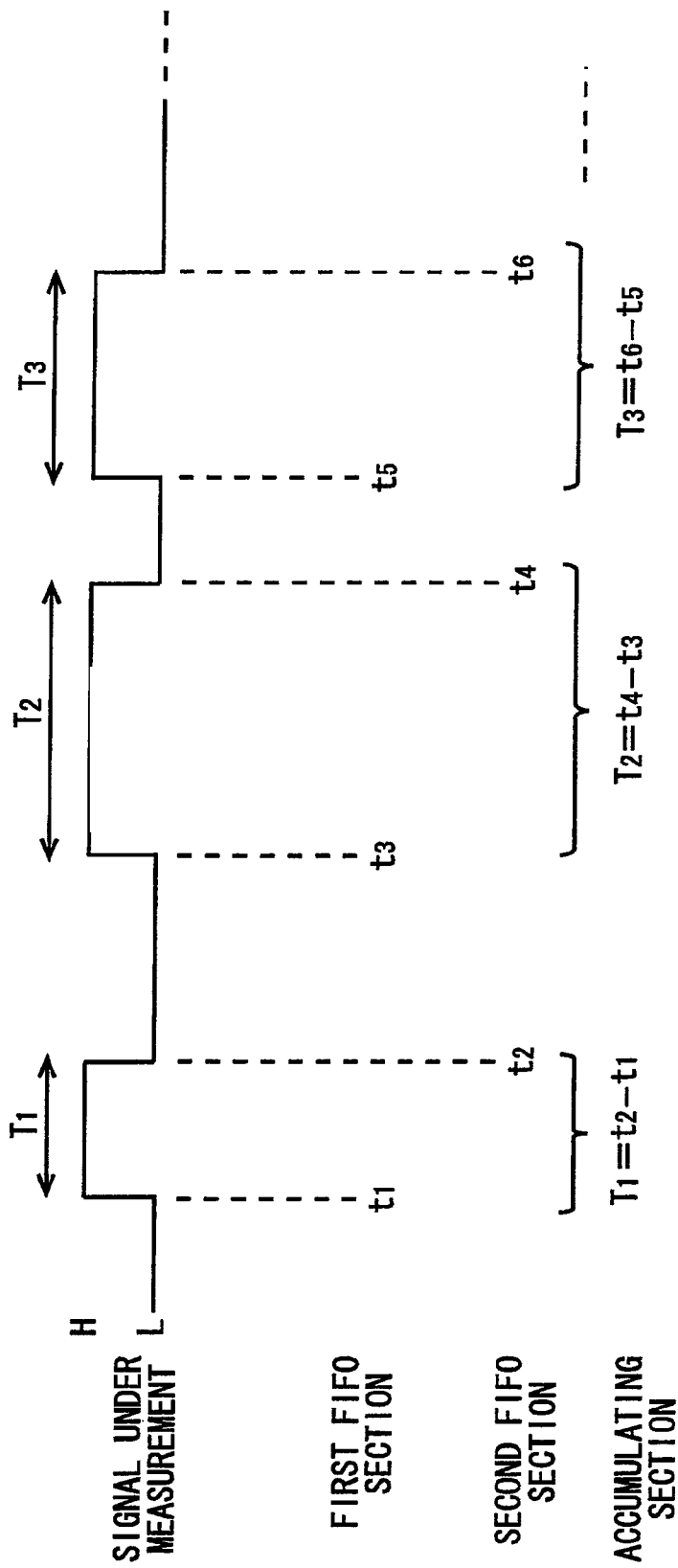
FIG. 4 shows an exemplary signal under measurement, the corresponding timings stored by the first FIFO section 42 and the second FIFO section 44, and the resulting calculation by the calculating section 46.

FIG. 3 shows an exemplary configuration of a measuring section 34 according to the present embodiment. FIG. 4 shows an exemplary signal under measurement, the corresponding timings stored by the first FIFO section 42 and the second FIFO section 44, and the resulting calculation by the calculating section 46. The measuring section 34 includes a calculating section 46, a cycle measuring section 48, a rising time measuring section 50, a falling time measuring section 52, an accumulating section 54, and an averaging section 56.

The calculating section 46 acquires data indicating first change timings and data indicating second change timings from the buffer section 32, and calculates the time difference between the first change timings and the second change timings. More specifically, the calculating section 46 sequentially acquires the piece data indicating the first change timing stored at the top of the first FIFO section 42 and the piece data indicating the second change timing stored at the top of the second FIFO section 44, and sequentially subtracts the value indicated by the data stored at the top of the first FIFO section 42 from the value indicated by the data stored at the top of the second FIFO section 44.

Therefore, if the first timing detecting section 28 detects rising edges and the second timing detecting section 30 detects falling edges, the calculating section 46 can sequentially calculate pulse widths from a rising edge to a falling edge of the signal under measurement, i.e. the period over which the signal under measurement is logic H. If the first timing detecting section 28 detects falling edges and the second timing detecting section 30 detects rising edges, the calculating section 46 can sequentially calculate pulse widths from a falling edge to a rising edge of the signal under measurement, i.e. the period over which the signal under measurement is logic L.

The cycle measuring section 48 sequentially acquires, from the buffer section 32, one of data indicating first change timings and data indicating second change timings, and calculates the cycle of the signal under measurement. For example, the cycle measuring section 48 sequentially acquires data indicating first change timings from the first FIFO section 42 and sequentially calculates time differences between two adjacent first change timings. In addition to or instead of calculating the cycle, the cycle measuring section 48 may calculate the frequency of the signal under measurement.

The rising time measuring section 50 acquires, from the buffer section 32, data indicating rising edges from among data indicating first change timings and data indicating second change timings, and sequentially calculates the time from a reference timing to each rising edge, i.e. the rising time of the signal under measurement. For example, the rising time measuring section 50 sequentially acquires data indicating first change timings from the first FIFO section 42 and calculates the time difference between the reference timing and the timing indicated by each piece of acquired data.

The falling time measuring section 52 acquires, from the buffer section 32, data indicating falling edges from among data indicating first change timings and data indicating second change timings, and sequentially calculates the time from a reference timing to each falling edge, i.e. the falling time of the signal under measurement. For example, the falling time measuring section 52 sequentially acquires data indicating second change timings from the second FIFO section 44 and calculates the time difference between the reference timing and the timing indicated by each piece of acquired data.

The accumulating section 54 calculates an aggregate time difference by adding together the plurality of time differences sequentially calculated by the calculating section 46. The accumulating section 54 may calculate an aggregate pulse width by adding together a predetermined number of pulse widths calculated by the calculating section 46. The averaging section 56 calculates an average time difference by dividing (i) the aggregate time difference calculated by the accumulating section 54 by (ii) the number of time differences in the plurality of time differences. The averaging section 56 may calculate an average pulse width by dividing (i) the aggregate pulse width calculated by the accumulating section 54 by (ii) the number of pulse widths added together by the accumulating section 54.

The accumulating section 54 may further calculate an aggregate of a plurality of cycles or frequencies sequentially calculated by the cycle measuring section 48, an aggregate of a plurality of rising times sequentially calculated by the rising time measuring section 50, and an aggregate of a plurality of falling times sequentially calculated by the falling time measuring section 52. In this case, the averaging section 56 may calculate an average cycle or frequency, an average rising time, or an average falling time by dividing (i) the aggregate cycle or frequency, the aggregate rising time, and the aggregate falling time calculated by the accumulating section 54 by (ii) the respective number of items used to calculate the aggregate.

The measuring section 34 supplies the judging section 18 with the calculated pulse width, the calculated cycle or frequency, the calculated rising time and falling time, and the average of at least one of these calculated values, according to the mode designated by the external section. The measurement apparatus 16 having the above configuration separately measures the first change timings and the second change timings of the signal under measurement, and the test apparatus 10 can therefore measure the pulse width of the signal under measurement without using a measurement circuit operating at high-speed. Furthermore, the test apparatus 10 measures the time differences after storing the data indicating the first change timings and the data indicating the second change timings in the first FIFO section 42 and the second FIFO section 44 respectively, and can therefore easily measure the pulse width even when the difference between the first change timings and the second change timings is relatively large.

Figure 5:
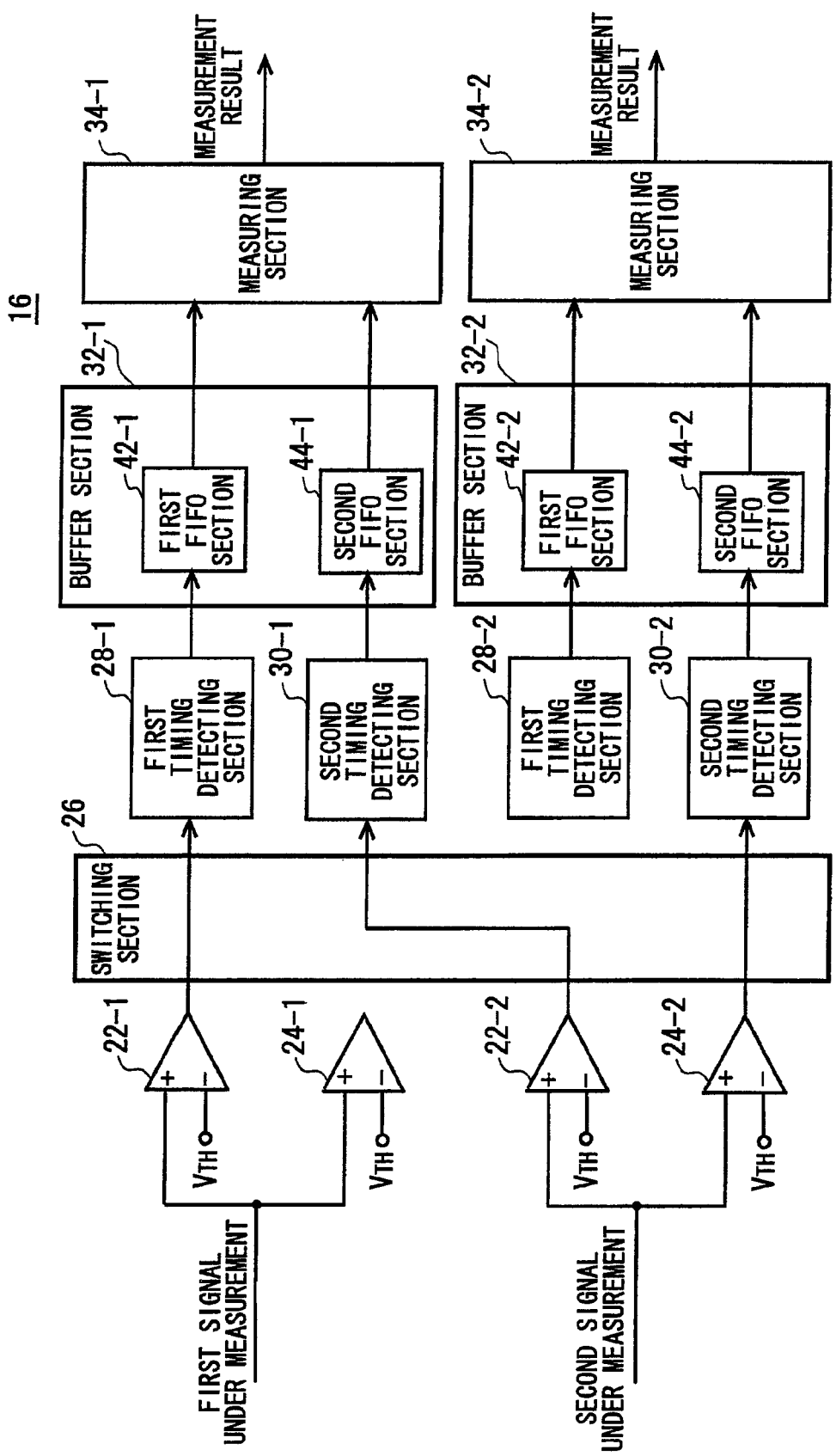
FIG. 5 shows an exemplary configuration of the measurement apparatus 16 according to a modification of the present embodiment.

FIG. 5 shows an exemplary configuration of the measurement apparatus 16 according to a modification of the present embodiment. The measurement apparatus 16 of the present modification adopts substantially the same configuration and function as the measurement apparatus 16 described in relation to FIG. 2, and therefore components that are the same as those in the measurement apparatus 16 of FIG. 2 are given the same numerals and the following description includes only differing points.

The measurement apparatus 16 of the present modification has a first channel configuration for measuring the pulse width of a first signal under measurement supplied from a first channel, e.g. a first pin of the device under test 200, and a second channel configuration for measuring the pulse width of a second signal under measurement supplied from a second channel, e.g. a second pin of the device under test 200. Furthermore, the measurement apparatus 16 of the present modification is provided with a switching section 26.

The switching section 26 switches whether (i) the first signal under measurement is supplied to both the first timing detecting section 28 and the second timing detecting section 30 or (ii) the first signal under measurement is supplied to the first timing detecting section 28 and the second signal under measurement is supplied to the second timing detecting section 30. More specifically, when measuring the pulse width of the first signal under measurement, the switching section 26 supplies the first timing detecting section 28 and the second timing detecting section 30 with the comparison signals output by the first comparing section 22-1 and the second comparing section 24-1, which are used for the first channel.

On the other hand, when measuring the time difference between the first signal under measurement and the second signal under measurement, the switching section 26 supplies the first timing detecting section 28 with the comparison signal output by the first comparing section 22-1 used for the first channel and supplies the second timing detecting section 30 with the comparison signal output by the first comparing section 22-2 used for the second channel. Instead, the switching section 26 may supply the first timing detecting section 28 with the comparison signal output by the second comparing section 24-1 used for the first channel and supply the second timing detecting section 30 with the comparison signal output by the second comparing section 24-2 used for the second channel. When measuring the time difference between the first signal under measurement and the second signal under measurement, the first timing detecting section 28 detects the change timings of the first signal under measurement as the first change timings and the second timing detecting section 30 detects the change timings of the second signal under measurement as the second change timings.

When measuring a phase difference between the first signal under measurement and the second signal under measurement, the calculating section 46 in the measuring section 34 acquires the data indicating the first change timings and the data indicating the second change timings from the buffer section 32 and calculates time differences between the first change timings and the second change timings. The measurement apparatus 16 described in the present embodiment can easily measure the phase difference between the first signal under measurement and the second signal under measurement.

Figure 6:
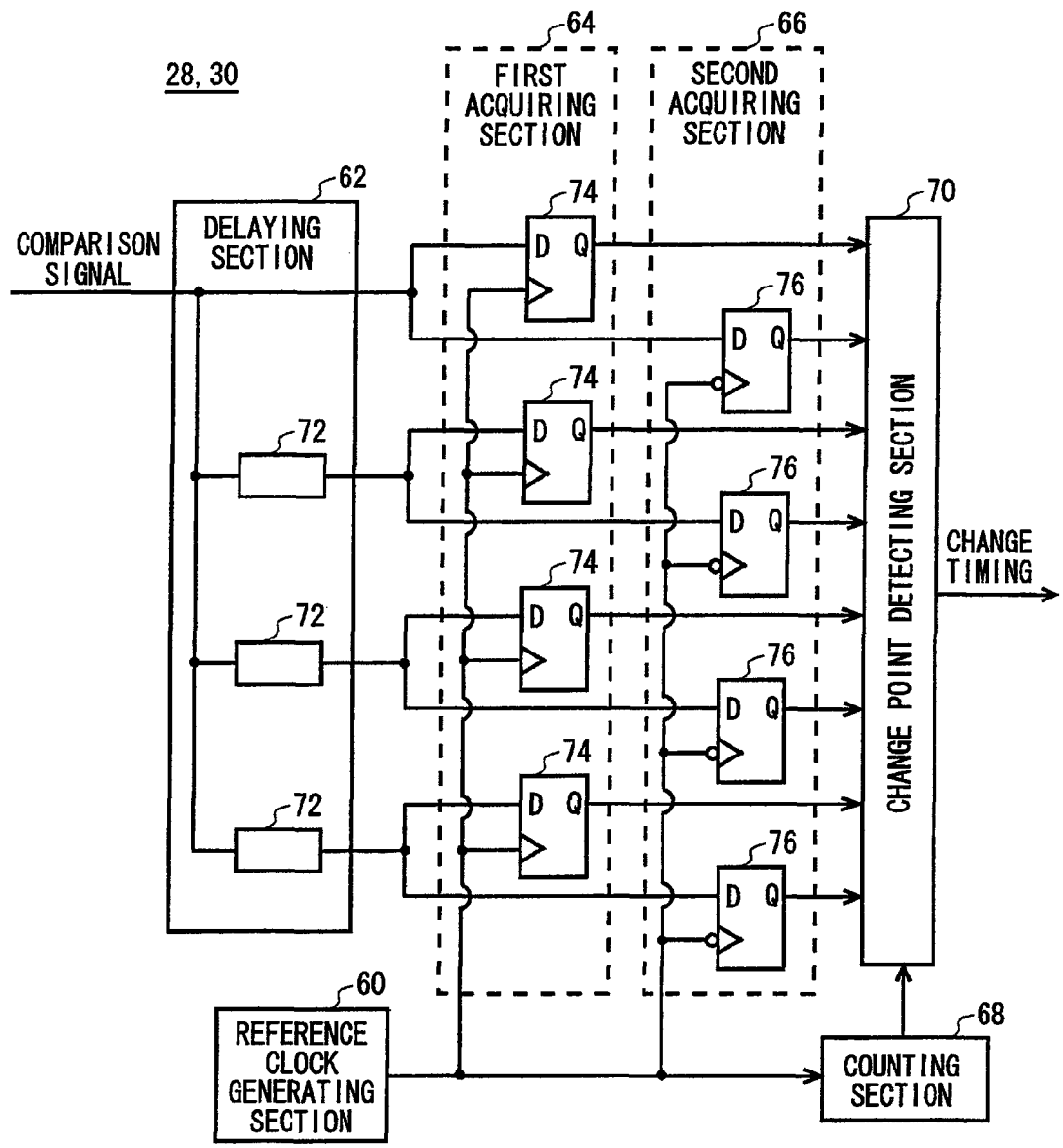
FIG. 6 shows a first exemplary configuration of the first timing detecting section 28 according to the present embodiment.

FIG. 6 shows a first exemplary configuration of the first timing detecting section 28 according to the present embodiment. The first timing detecting section 28 and the second timing detecting section 30 have the same configuration, and therefore a separate description of the second timing detecting section 30 is not provided.

The first timing detecting section 28 includes a reference clock generating section 60, a delaying section 62, a first acquiring section 64, a second acquiring section 66, a counting section 68, and a change point detecting section 70. The reference clock generating section 60 generates a reference clock. For example, the reference clock generating section 60 generates a reference clock with a duty ratio of 50%.

The delaying section 62 generates a plurality of delayed signals by applying different delay times to a comparison signal supplied thereto, e.g. a pulse signal indicating the first change timings of the signal under measurement. The delaying section 62 may include a plurality of delay elements 72, which are each set to have a different delay amount. Each delay element 72 outputs a delayed signal obtained by delaying the comparison signal. In the present embodiment, the delaying section 62 generates four delayed signals.

The first acquiring section 64 acquires a value, e.g. a logic value, of each delayed signal at first phases of the reference clock. For example, the first acquiring section 64 acquires the value of each delayed signal at the rising edges of the reference clock.

In the present embodiment, the first acquiring section 64 includes a plurality of first latch sections 74 that correspond one-to-one with the plurality of delayed signals. Each first latch section 74 acquires the value of the corresponding delayed signal at the timings of the rising edges of the reference clock.

The second acquiring section 66 acquires a value, e.g. a logic value, of each delayed signal at second phases of the reference clock, which are different from the first phases. For example, the second acquiring section 66 acquires the value of each delayed signal at the falling edges of the reference clock.

In the present embodiment, the second acquiring section 66 includes a plurality of second latch sections 76 that correspond one-to-one with the plurality of delayed signals. Each second latch section 76 acquires the value of the corresponding delayed signal at the timings of the falling edges of the reference clock.

The counting section 68 counts the number of clocks of the reference clock generated by the reference clock generating section 60. For example, the counting section 68 resets the count at a reference time and then counts the number of clocks of the reference clock from the reference time.

The change point detecting section 70 detects the timings of the change points of the comparison signal based on the value of each of the plurality of delayed signals acquired by the first acquiring section 64 and the second acquiring section 66. For example, the change point detecting section 70 identifies the timings of the change points of the comparison signal as being the timings of the rising edges or the falling edges of the comparison signal. The manner in which the change point detecting section 70 detects the timings of the change points of the comparison signal is described in detail in relation to FIG. 7.

Figure 7:
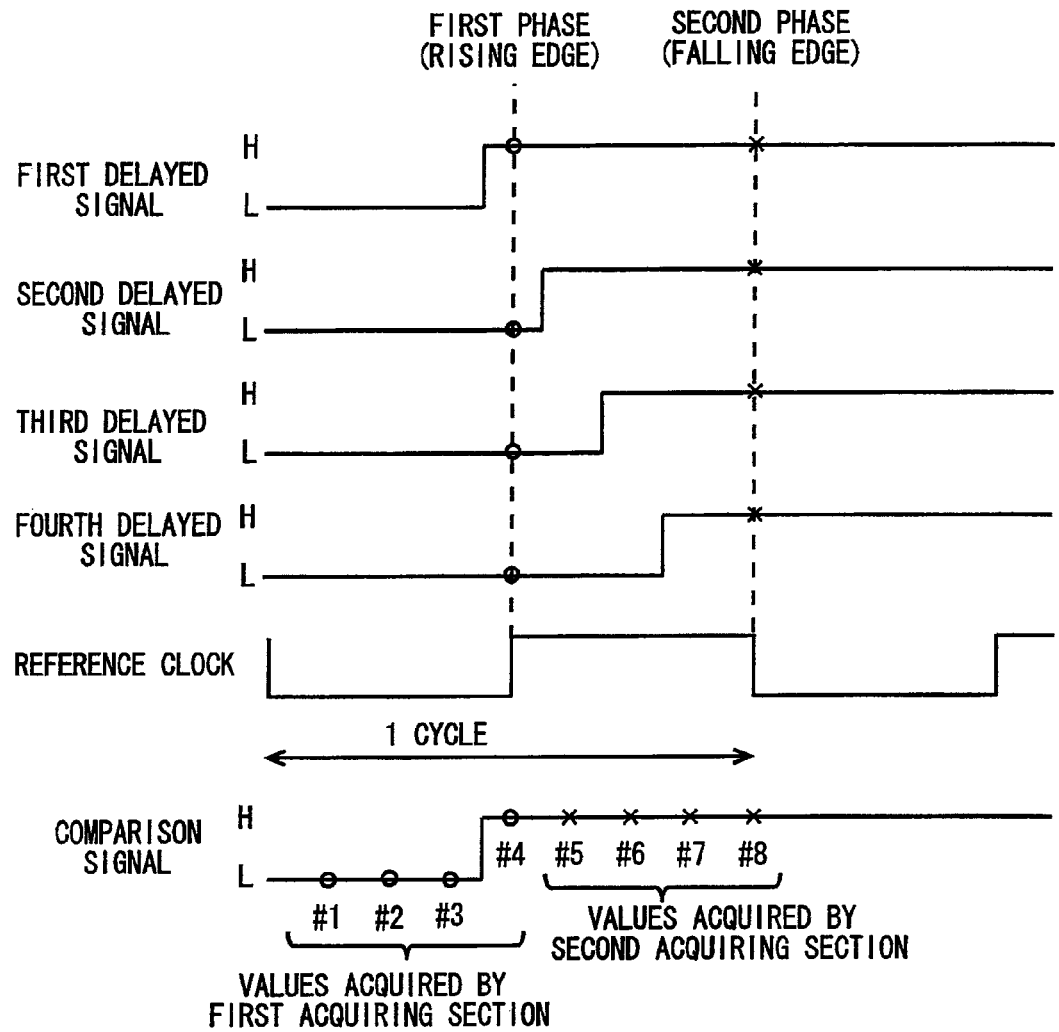
FIG. 7 shows examples of the four delayed signals, the reference clock, and the signal under measurement.

FIG. 7 shows examples of the four delayed signals, the reference clock, and the comparison signal. The delaying section 62 delays the delayed signals such that the timing at which each value is acquired is within one cycle of the reference clock when the values of the plurality of delayed signals acquired by the first acquiring section 64 and the second acquiring section 66 in the same cycle of the reference clock are arranged in time-series in the comparison signal. In this way, the delaying section 62 can use the first acquiring section 64 and the second acquiring section 66 to acquire the value of the comparison signal at intervals that are less than one cycle of the reference clock.

If N delayed signals are generated, where N is an integer greater than 1, the delaying section 62 may generate each delay signal to be delayed relative to each other by a time of $1/(2 \times N)$ cycles of the reference clock. Therefore, when the duty ratio of the reference clock is 50% and (i) the values of the plurality of delayed signals acquired by the first acquiring section 64 at the rising edges and (ii) the values of the plurality of delayed signals acquired by the second acquiring section 66 at the falling edges are arranged in time-series in the comparison signal, the delaying section 62 can keep the acquisition timing of each value within one cycle of the reference clock.

The change point detecting section 70 reads, for each cycle of the reference clock, the values of the delayed signals acquired by the first acquiring section 64 and the values of the delayed signals acquired by the second acquiring section 66. If the values of the plurality of delayed signals acquired by the first acquiring section 64 and the second acquiring section 66 are arranged in time-series in the comparison signal, the change point detecting section 70 may then detect that the comparison signal has changed between the acquisition timings of two values on a condition that these two values are adjacent and different.

For example, the change point detecting section 70 detects (i) a portion at which two adjacent values switch from logic L to logic H or (ii) a portion at which two adjacent values switch from logic H to logic L, and then judges that the comparison signal changes between the acquisition timings of these two values. For example, the change point detecting section 70 may be set by an external section to detect either the portion at which the adjacent values switch from logic L to logic H or the portion at which the adjacent values switch from logic H to logic L.

In the example of FIG. 7, the change point detecting section 70 detects a change in the value of the comparison signal between the third acquisition timing, which is logic L, and the fourth acquisition timing, which is logic H, when the values of the delayed signals are arranged in time-series in the comparison signal. The change point detecting section 70 then calculates the timing of the change point within one cycle of the reference clock based on the acquisition timings of the adjacent values detected as being different. The change point detecting section 70 described above can detect the timing of a point at which the value of the comparison signal changes with an accuracy more precise than one cycle of the reference clock.

Furthermore, the change point detecting section 70 may detect the timing of a change point of the comparison signal based on the number of clocks counted by the counting section 68 and the values of the delayed signals acquired by the first acquiring section 64 and the second acquiring section 66. In this way, the change point detecting section 70 can measure a time greater than one cycle of the reference clock.

The first timing detecting section 28 described above can detect a timing of a change point of the comparison signal with an accuracy more precise than one cycle of the reference clock, without using an expensive device such as an AD converter. In other words, the first timing detecting section 28 can accurately detect the timing of a change point of a signal under measurement.

The first timing detecting section 28 may be further provided with an acquiring section that acquires values of the delayed signals at phases other than the first and second phases of the reference clock. For example, the first timing detecting section 28 may further include an acquiring section that acquires a plurality of delayed signals at an intermediate phase that is between the rising edges and the falling edges of the reference clock.

The detection apparatus 14 may generate timings that indicate phases obtained by dividing one cycle of the reference clock into quarters, so as to perform memory data transfer using a QDR (Quad Data Rate) or the like, and acquire a plurality of delayed signals at each of these phases. In this case, the change point detecting section 70 detects the change points of the signal under measurement including the plurality of values acquired at the first phases and the second phases. This first timing detecting section 28 can more accurately detect the change points of the signal under measurement. Furthermore, the detection apparatus 14 may be configured as an FPGA (Field Programmable Gate Array) including the first acquiring section 64, the second acquiring section 66, the counting section 68, and the change point detecting section 70.

Figure 8:
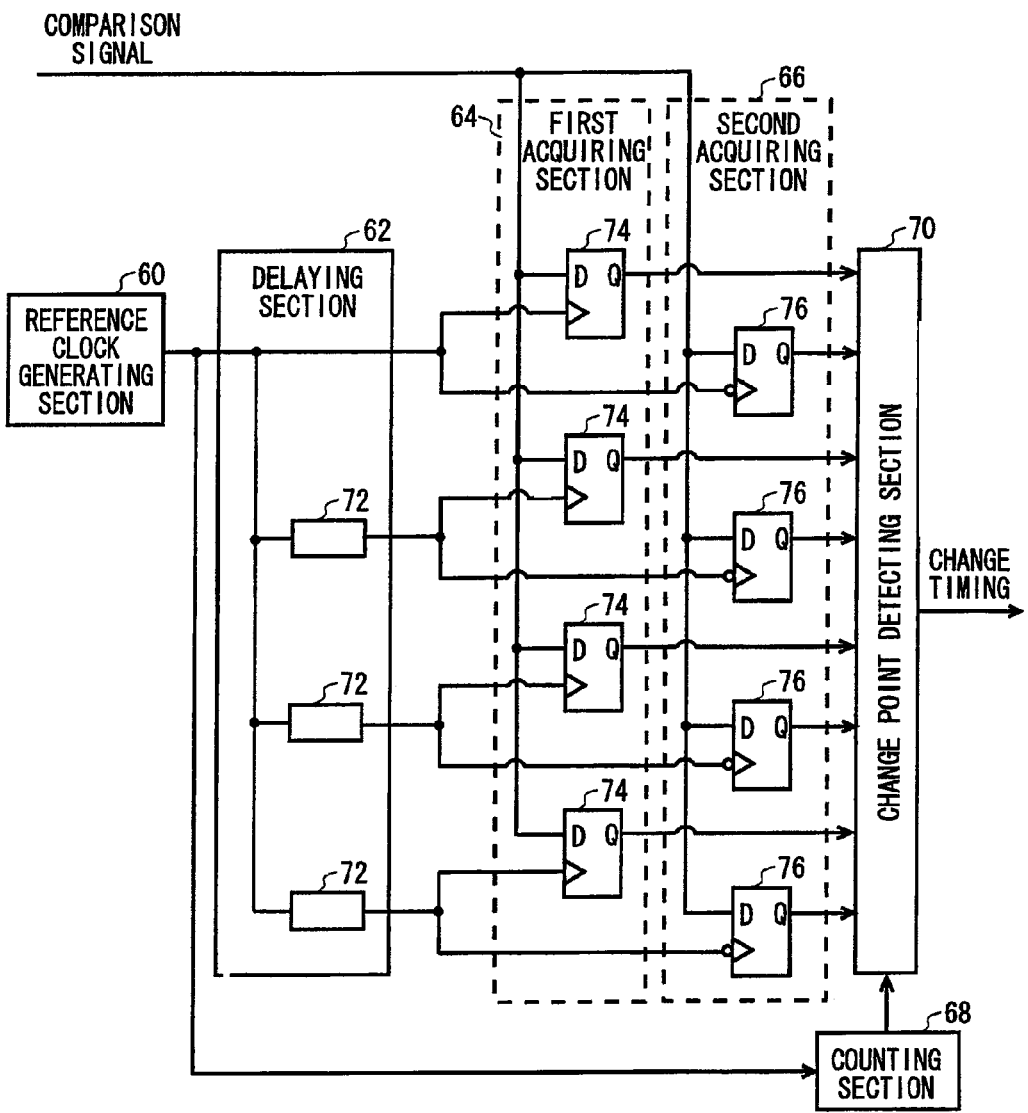
FIG. 8 shows a second exemplary configuration of the first timing detecting section 28 according to the present embodiment.

FIG. 8 shows a second exemplary configuration of the first timing detecting section 28 according to the present embodiment. The first timing detecting section 28 of the second example has the same function and configuration as the first timing detecting section 28 described in relation to FIG. 6, and therefore components that are the same as those of the first timing detecting section 28 of FIG. 6 are given the same numerals and the following description includes only differing points.

Instead of delaying the signal under measurement, the delaying section 62 generates the plurality of delayed signals by delaying the reference clock generated by the reference clock generating section 60 by differing delay amounts. In the present example, the delaying section 62 includes a plurality of delay elements 72 that each delay the reference clock by a different set delay amount.

The first acquiring section 64 acquires the value, i.e. the logic value, of the signal under measurement at the first phases of each of the delayed signals. For example, the first acquiring section 64 acquires the value of the signal under measurement at the rising edges of each of the delayed signals. In the present example, the first acquiring section 64 includes a plurality of first latch sections 74 that correspond one-to-one with the plurality of delayed signals. Each first latch section 74 acquires the value of the signal under measurement at the timings of the rising edges of the corresponding delayed signal.

The second acquiring section 66 acquires the value, i.e. the logic value, of the signal under measurement at the second phases of each of the delayed signals. For example, the second acquiring section 66 acquires the value of the signal under measurement at the falling edges of each of the delayed signals. In the present example, the second acquiring section 66 includes a plurality of second latch sections 76 that correspond one-to-one with the plurality of delayed signals. Each second latch section 76 acquires the value of the signal under measurement at the timings of the falling edges of the corresponding delayed signal. In the same manner as the first timing detecting section shown in FIG. 6, the first timing detecting section 28 according to the present modification can detect a timing of a change point of the comparison signal with an accuracy more precise than one cycle of the reference clock, without using an expensive device such as an AD converter.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A measurement apparatus comprising:
a first timing detecting section that detects first change timings of a signal under measurement;
a second timing detecting section that detects second change timings of the signal under measurement;
a buffer section that buffers data indicating the first change timings detected by the first timing detecting section and data indicating the second change timings detected by the second timing detecting section; and
a calculating section that acquires, from the buffer section, the data indicating the first change timings and the data indicating the second change timings, calculates a time difference between the first change timings and the second change timings, and outputs the time difference, wherein the buffer section includes:
  a first FIFO section that sequentially stores pieces of the data indicating the first change timings detected by the first timing detecting section, and sequentially outputs the stored pieces of data in an order in which the pieces of data were received; and
  a second FIFO section that sequentially stores pieces of the data indicating the second change timings detected by the second timing detecting section, and sequentially outputs the stored pieces of data in an order in which the pieces of data were received.

2. The measurement apparatus according to claim 1, further comprising
  an edge adjusting section that deletes one piece of data indicating a second change timing stored at the top of the second FIFO section when the piece of data indicating the second change timing stored at the top of the second FIFO section is earlier than a piece of data indicating a first change timing stored at the top of the first FIFO section, wherein
  the calculating section acquires, from the first FIFO section and the second FIFO section, a piece of data indicating a first change timing and a piece of data indicating a second change timing that is later than the first change timing, and calculates the time difference by subtracting the first change timing from the second change timing.

3. The measurement apparatus according to claim 2, wherein
  the first timing detecting section and the second timing detecting section detect, as the first change timings and the second change timings respectively, rising edges at which the signal under measurement changes from a value that is less than a threshold value to a value that is greater than a threshold value and falling edges at which the signal under measurement changes from a value that is greater than a threshold value to a value that is less than a threshold value.

4. The measurement apparatus according to claim 3, further comprising
  an edge designating section that designates, for the first timing detecting section and the second timing detecting section, which of the rising edges or the falling edges are to be detected as the first change timings and which are to be detected as the second change timings.

5. The measurement apparatus according to claim 4, wherein
  when measuring a pulse width of the signal under measurement, the edge designating section designates, for the first timing detecting section and the second timing detecting section, that one of the rising edges and the falling edges is to be detected as the first change timings and that the other is to be detected as the second change timings.

6. The measurement apparatus according to claim 4, further comprising
  a switching section that switches whether (i) a first signal under measurement is supplied to both the first timing detecting section and the second timing detecting section or (ii) the first signal under measurement is supplied to the first timing detecting section and a second signal under measurement is supplied to the second timing detecting section, wherein, when measuring the time difference between the first signal under measurement and the second signal under measurement, the switching section supplies the first signal under measurement to the first timing detecting section and supplies the second signal under measurement to the second timing detecting section, the first timing detecting section detects change timings of the first signal under measurement as the first change timings, the second timing detecting section detects change timings of the second signal under measurement as the second change timings, and the calculating section calculates the time differences between the first change timings and the second change timings.

7. The measurement apparatus according to claim 2, further comprising:
  an accumulating section that calculates an aggregate of the plurality of time differences sequentially calculated by the calculating section by adding together the plurality of time differences; and
  an averaging section that calculates an average time difference by dividing (i) the aggregate of the plurality of time differences calculated by the accumulating section by (ii) the number of time differences added together to achieve the aggregate.

8. The measurement apparatus according to claim 1, wherein
  the first timing detecting section and the second timing detecting section each include:
    a delaying section that generates a plurality of delayed signals by delaying the signal under measurement by a plurality of different delay amounts;
    a first acquiring section that acquires each of the plurality of delayed signals at a first phase of a reference clock;
    a second acquiring section that acquires each of the plurality of delayed signals at a second phase of the reference clock, which is different from the first phase; and
    a change point detecting section that detects a change point of the signal under measurement based on values of the delayed signals acquired by the first acquiring section and values of the delayed signals acquired by the second acquiring section.

9. A measurement method comprising:
  detecting first change timings of a signal under measurement;
  detecting second change timings of the signal under measurement;
  sequentially storing, in a first FIFO section, pieces of data indicating the first change timings, and sequentially outputting the stored pieces of data in an order in which the pieces of data were received;
  sequentially storing, in a second FIFO section, pieces of data indicating the second change timings and sequentially outputting the stored pieces of data in an order in which the pieces of data were received; and
  acquiring the data indicating the first change timings from the first FIFO section and the data indicating the second change timings from the second FIFO section, calculating a time difference between the first change timings and the second change timings, and outputting the time difference.

10. A test apparatus that tests a device under test, comprising:
  a test signal supplying section that supplies the device under test with a test signal for testing the device under test; and a measurement apparatus that measures a timing of a response signal output by the device under test in response to the test signal, wherein the measurement apparatus includes:

a first timing detecting section that detects first change timings of the response signal;

a second timing detecting section that detects second change timings of the response signal;

a first FIFO section that buffers the first change timings detected by the first timing detecting section;

a second FIFO section that buffers the second change timings detected by the second timing detecting section; and a calculating section that acquires, from the first FIFO section and the second FIFO section, the first change timings and the second change timings, calculates a temporal relationship between the first change timings and the second change timings, and outputs the temporal relationship.

* * * * *